United States Patent
Casey (10) Patent No.: US 6,229,210 B1
(45) Date of Patent: May 8, 2001

(54) DEVICE AND METHOD FOR ATTACHING AND SOLDERING PRE-FORMED SOLDER SPHERES TO THE BALL GRID ARRAY (BGA) INTEGRATED CIRCUIT PACKAGE ATTACHMENT SITES IN HIGH VOLUME

(75) Inventor: William J. Casey, Meridian, ID (US)

(73) Assignee: MCMS, Inc., Nampa, ID (US)

( * ) Notice: Subject to any disclaimer, the term of this patent is extended or adjusted under 35 U.S.C. 154(b) by 0 days.

(21) Appl. No.: 09/206,197

(22) Filed: Dec. 4, 1998

(51) Int. Cl.7 .................................................. H01L 23/48
(52) U.S. Cl. ........................ 257/737; 257/738; 257/778
(58) Field of Search .................................... 257/737, 738, 257/778

(56) References Cited

U.S. PATENT DOCUMENTS 5,844,316 * 12/1998 Mallik et al. ...................... 257/738
5,883,438 * 3/1999 Kang ................................... 257/738

* cited by examiner

Primary Examiner—Roy Potter
(74) Attorney, Agent, or Firm—Joseph W. Holland (57) ABSTRACT

A device and method for high volume solder sphere alignment and placement including the high volume solder sphere alignment and placement for BGA and CSP packages including a pre-form stencil having a pattern of apertures formed through its cross-section, that corresponds to the pattern of the exposed conductive lands of a circuit requiring sphere alignment and placement. The apertures may be formed having diameters that are approximately 5% larger in diameter than the solder spheres. The method for high volume solder sphere alignment and placement may include the steps of prepping the workpiece, applying a thin layer of flux to the conductive lands. Aligning the pre-form stencil with the part to which the solder balls are to be aligned with and placed upon. Applying the solder spheres through the pattern of apertures onto the conductive lands. Application may take place either by brushing or by spreading the spheres with a generally U-shaped blade wherein the solder spheres are contained between the legs of the U-shaped blade during application.

8 Claims, 6 Drawing Sheets

DEVICE AND METHOD FOR ATTACHING AND SOLDERING PRE-FORMED SOLDER SPHERES TO THE BALL GRID ARRAY (BGA) INTEGRATED CIRCUIT PACKAGE ATTACHMENT SITES IN HIGH VOLUME

BACKGROUND OF THE INVENTION

1. Technical Field

This invention generally relates to methods and devices for applying solder to workpieces and more particularly to a device and method for high volume Ball Grid Array (BGA) solder sphere alignment and placement.

2. Background

Electronic fabrication processes include the attachment of various electrical components, including discrete components. This may include, but is not limited to: resistors, transistors, diodes, switching arrays and integrated circuits such as memory devices, microprocessors, and the like, together with a variety of other electrical components such as transformers, connectors, heat sinks connected to a substrate such as a printed circuit board that electrically connects and mechanically supports the variety of components.

Soldering is the most common process used for connecting the variety of electrical components to the printed circuit board and fixing them in position. Soldering involves the use of a low melting point metal alloy, usually of a lead-tin type, that when exposed to heat, typically at temperatures around 450° F., (183° C.), melts and flows between adjoining metal surfaces or contacts, joining the adjacent surfaces together.

Most soldering processes include three basic steps: pre-cleaning and deoxidizing, solder reflow or reflow joining, and post-cleaning of residue. Pre-cleaning and deoxidizing are usually accomplished by applying a flux material to remove contaminants and oxides from the surfaces to be soldered. Soldering joins the surfaces to be soldered when the solder is heated beyond its melting point. Oxides, typically with a higher melting point than solder, can form a barrier and prevent wetting of the surfaces to be soldered if they are not removed prior to the solder reflowing.

In electronic substrate fabrication, lands are commonly formed on an exposed surface of the printed circuit board and, during the solder process, receive a coating of solder. The electrically conductive leads of the variety of electrical components are brought into contact with the electrically conductive lands, heat is applied to raise the temperature of the lands and leads, and the solder is then heated to reflow and physically join the lands and pads. When the solder cools, it resolidifies, thereby providing an electrically conductive connection.

Ball Grid Array (BGA) packages and Chip Scale packages (CSPs) are rapidly becoming a favored configuration for fine and ultra-fine pitch technology. The ability to achieve high density interconnects, while providing an extremely reliable assembly process, has increased the industry wide migration to this component configuration. The high cost of these components drives the need to salvage or reclaim BGA and CSP packages during the assembly or rework process.

Until recently, BGA and CSP packages which had re-workable defects such as solder shorts or low volume solder were removed from the printed circuit assembly (PCA) and disposed of. It is therefore desirable to salvage BGA or CSP packages thereby reducing the cost of rework.

Component removal and subsequent printed circuit board (PCB) and BGA and CSP package surface site preparation is important for achieving successful re-work of the assemblies. In order to provide a reliable interconnect site during re-work, one must insure that site preparation be carefully conducted. It is extremely important that parameters such as coplanarity, contamination, pad damage, moisture sensitivity and component handling be strictly controlled.

Component removal from the electronic assembly is typically achieved by employing reflow equipment and must be conducted employing the proper reflow profiles to maintain the integrity of the BGA and CSP packages. The reflow and removal process is one of the most important steps in re-work. Because the removal of the original BGA or CSP package results in the release of excess solder on the substrate from the sphere and printed solder mass, it must be carefully removed to provide a planar contamination-free attachment sight. There are several methods by which this can be completed, the most common of which is the utilization of Solder-Wick™ (high purity copper braid).

Another common method of removal is the use of a non-contact scavenging system that utilizes nitrogen gas and a vacuum apparatus to lift the molten solder off the lands without physically touching the substrate lands. These systems do provide a superior removal method by controlling temperature and contact damage to the attachment sites. These systems can be rather expensive and thus are not in consistent use as a result.

Following the removal and scavenging of the BGA and CSP packages, a thorough visual inspection may take place. Component land damage is a common problem when dealing with contact scavenging methods. Poor or damaged masking patterns, reduction of the mask volume or physical damage can cause a multitude of solder-ability problems such as shorting.

Following the removal, scavenging and inspection of reclaimed BGA and CSP packages, the BGA and CSP packages must be re-balled. Re-balling involves the alignment and the placement of the solder spheres on the electrically conductive lands. A variety of methods are currently employed for accomplishing this task.

The first is to hand place solder spheres onto fluxed locations. This is quite obviously a slow process.

A second method involves the use of mechanical equipment to individually place sphere pre-forms onto a fluxed or solder printed BGA or CSP package land. This is achieved using an automated encapsulation or dispensing machine which is designed specifically for the alignment and placement of the packages being assembled and which has been programmed to place the spheres in a pre-selected pattern. This mechanism works much like a pick and place machine utilizing x, y, and z coordinate systems.

This process, however, is labor intensive, due to programming requirements, although the results tend to be highly accurate and repeatable. This automated process involves the placement of the component in an alignment tool on an x-y platform. The dispensing machine then may distribute flux in a pre-established and controlled volume onto each placement site. A separate needle vacuum fixture retrieves a single ball from a sphere pool and places it on the fluxed land. This process is repeated until the array has been completed.

The major benefit to this system is the accuracy and semi-automatic use. The major drawbacks with this system are the cost of initial implementation, programming costs and the cost associated with changing the platform. Because the system is designed around a single package, the shift from a primary package design can lead to substantial expense.

Another method uses a paper array which has pre-formed solder spheres impregnated in the paper matrix which corresponds to the circuit package being reballed. The paper array may be purchased with hundreds of different array designs and is relatively inexpensive and readily available. The process involves the normal component preparation as seen with other re-balling processes. First, a re-balling flux is brushed lightly onto the component. The paper pre-form is then placed on the package in an alignment fixture. The entire system is reflowed to provide attachment. After reflow the paper matrix is dissolved in a de-ionized water bath leaving only the attached balls.

The major benefits to this system are accuracy, speed, and ease of use, however, there are two drawbacks. First is the need to purchase the paper matrix. Secondly the system does not work well on under-molded BGAs due to the fact that the molding increases the standoff height of the paper matrix.

SUMMARY OF THE INVENTION

The device for high volume solder sphere alignment and placement, including the high volume solder sphere alignment and placement for BGA and µBGA packages, includes a pre-form stencil that may be formed of sheet material typically having a thickness of 0.015" to 0.035". The pre-form stencil may be formed of a nickel chrome material such as Alloy 42, a stainless steel or possibly a polyetherimide resin. The pre-form stencil is formed having a pattern of apertures formed therethrough, that corresponds to the pattern of the exposed conductive surfaces of the printed circuit. The apertures may be formed having diameters that are approximately 5% larger in diameter than the solder spheres. The ball pattern of each component may be chemically etched or laser cut into the stencil.

The method for high volume solder sphere alignment and placement includes the steps of prepping the workpiece which may include pre-cleaning and deoxidizing the variety of electrical components for attachment to a pre-cleaned and deoxidized substrate, applying a thin layer of flux to the attachment sites, aligning the pre-form stencil with the part to which the solder balls are to be aligned with and placed upon and applying the solder spheres through the apertures onto the attachment sites. Application may take place either by brushing or by spreading the spheres with a generally U-shaped blade wherein the solder spheres are contained between the legs of the U-shaped blade during application.

One method for high volume BGA solder sphere alignment and placement includes the steps of applying a solder flux to the conductive surface pads or lands of a ball grid array package utilizing a normal solder printing application with a screen printing mechanism and properly designed apertures. A second pre-form stencil which may or may not utilize a second screen printing machine is constructed with a moderately thick surface foil and apertures which are enlarged enough to not only capture the pre-formed solder balls, aligning the solder balls onto the pads, but to have enough room to release them properly.

The solder balls are applied and distributed over the surface of the pre-form stencil using one of two different methods. According to a first method, the solder balls are applied and distributed over the surface of the pre-form stencil by brushing of a pool of solder balls into the over sized apertures in the thick pre-form stencil foil. The second method employs the use of an automated printing mechanism to distribute the solder spheres across the apertures using a flexible generally U-shaped blade. As the blade moves across the pre-form stencil surface the spheres fall into the alignment holes. The stencil blade may be configured to exert a small amount of pressure to the solder sphere, seating the sphere in the preapplied flux.

The package with the preliminarily attached solder balls is then reflowed to make the final attachment. The flux provides a bonding agent which maintains the position of the solder balls and package while the solder is reflowed.

The method for high volume BGA solder sphere alignment and placement according to the present invention provides accurate sphere alignment and easy recognition of missing sphere sites due to two dimensional verification by the printing equipment. The overall alignment of the array patterns or sphere X, Y, coordinate location is much improved over prior art processing methods. The use of a fixture to hold the spheres in location has provided a much improved method of sphere alignment and decreased alignment problems. The increased solder release characteristics associated with adding a solder-phobic barrel to the over-bored alignment hole provides an extremely accurate method of sphere attachment. The solder-phobic barrel may be formed form titanium.

Other advantages of the device and method for high volume BGA solder sphere alignment and placement according to the present invention include an extremely high product out-put, a substantially reduced initial cost, reduced setup costs when package designs are changed and highly accurate attachment due to sphere self-alignment properties.

Because a screen printer is used to apply the solder spheres, costs associated with the purchase and set-up of additional equipment is eliminated. Additionally, the materials used for fabricating are readily available and materials which are routinely worked with in associated processes.

Additional advantages and novel features of the invention will be set forth in part in the description that follows, and in part will become apparent to those skilled in the art upon examination of the following, or may be learned by practice of the invention. The advantages of the invention may be realized and attained by means of the instrumentalities and combinations particularly pointed out in the appended claims.

DETAILED DESCRIPTION OF THE INVENTION

Referring now to the Figures, the device and method for high volume BGA solder sphere alignment and placement will be more fully described.

Figure 1:
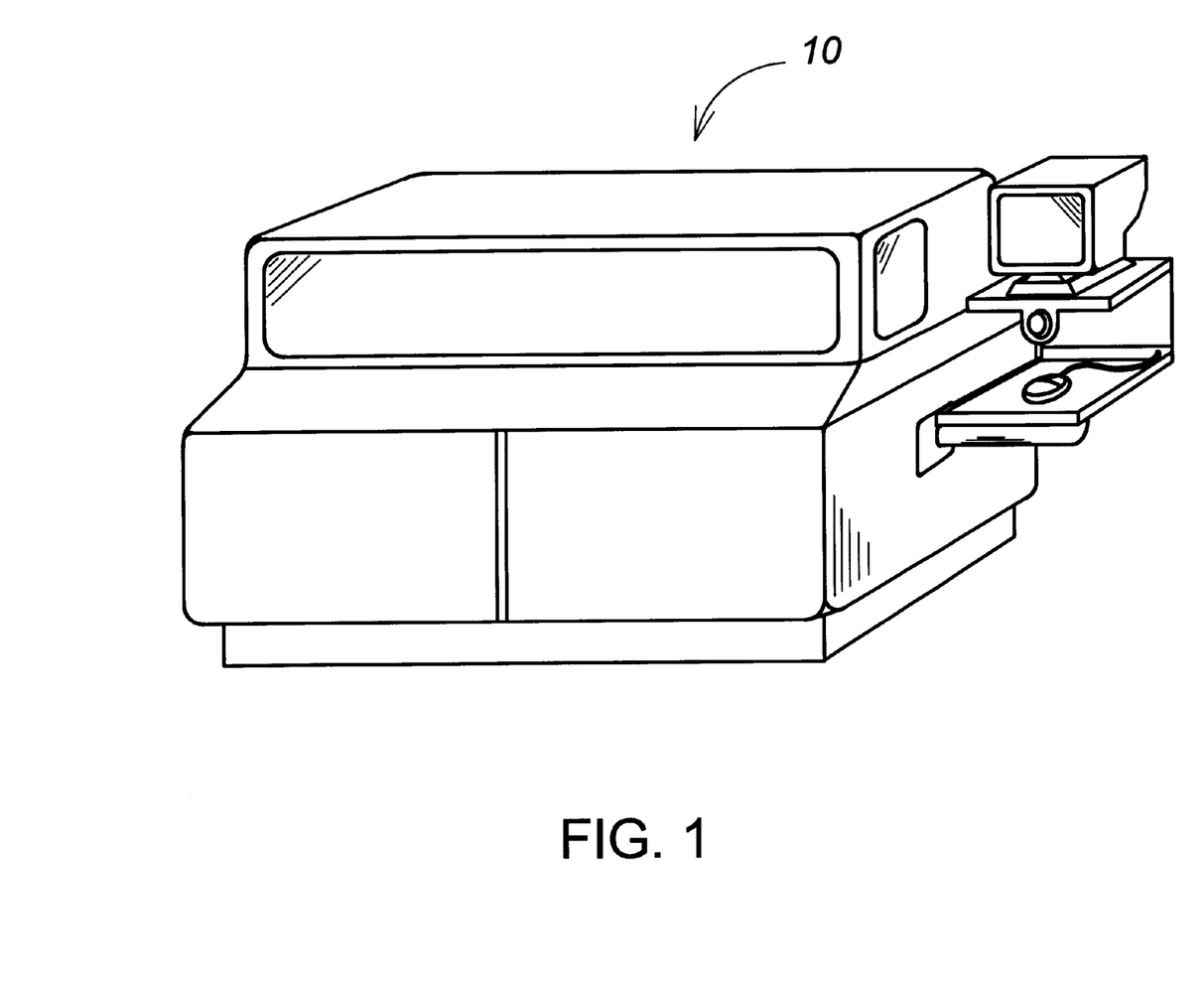
FIG. 1 is a perspective representational view of a stencil printer which may be employed in the method for high volume BGA solder sphere alignment and placement.

Referring to FIG. 1, a stencil printer 10 is shown which may be employed in the method for high volume BGA solder sphere alignment and placement.

Figure 2:
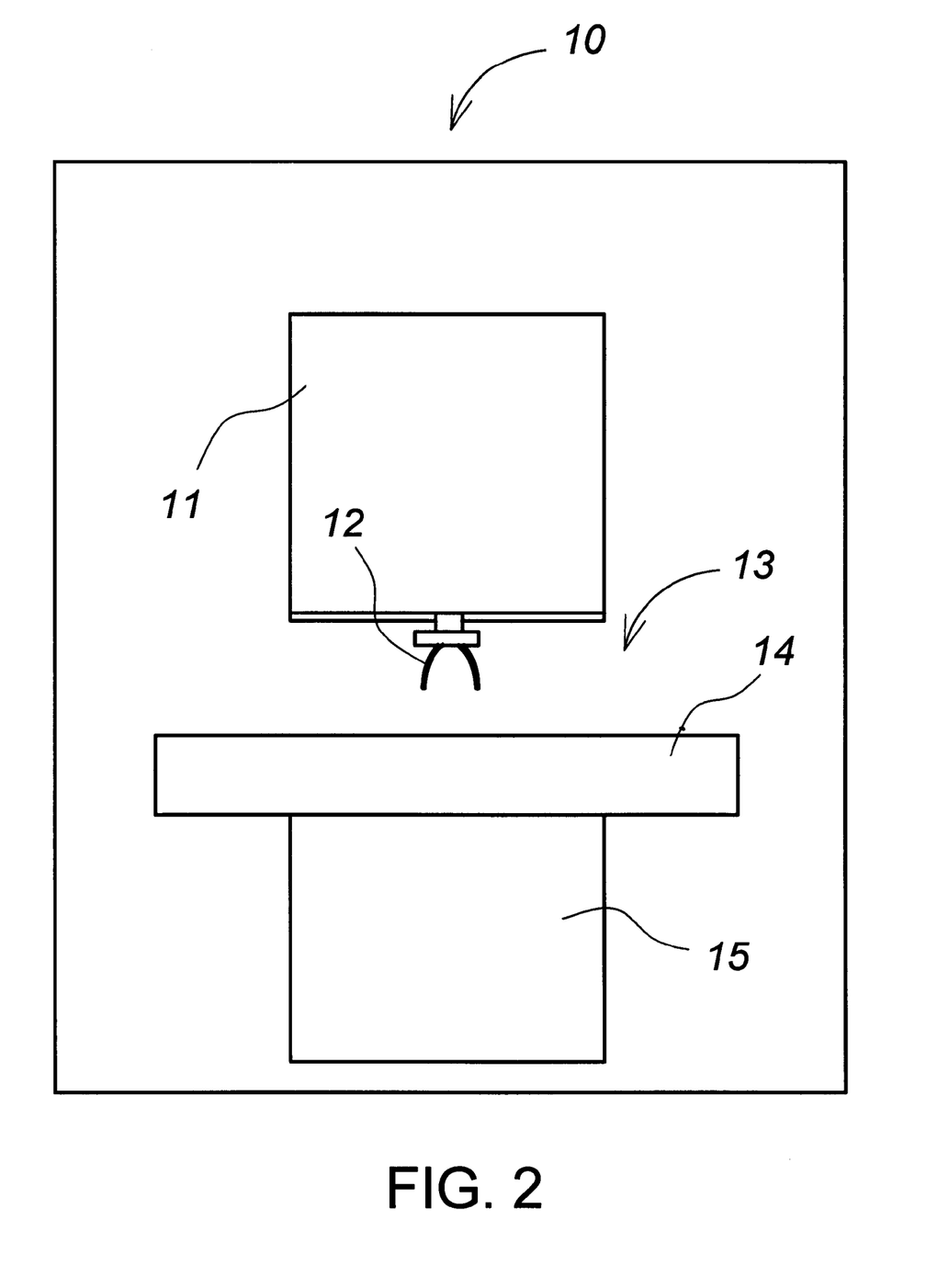
FIG. 2 is a schematic representation of the stencil printer utilized for high volume BGA solder sphere alignment and placement.

Referring to FIG. 2, stencil printer 10 is shown including print head 11 and stencil assembly 13. Stencil assembly 13 includes stencil frame 14 which is mounted to work table 15. Print head 11 is also shown including generally U-shaped wiper fixture 12.

Figure 3:
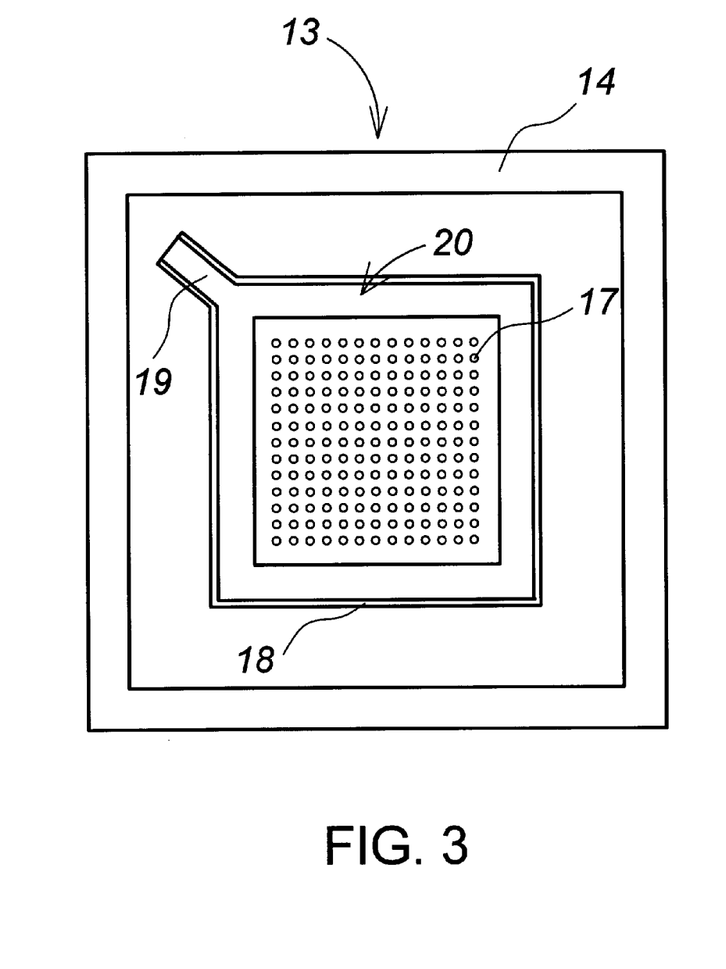
FIG. 3 is a schematic representation of a pre-form stencil utilized for high volume BGA solder sphere alignment and placement.

Referring to FIG. 3, one embodiment of a pre-form stencil employed in the method for high volume BGA solder sphere alignment and placement is shown. Stencil assembly 13 is shown including stencil frame 14 surrounding pre-form stencil 16. Pre-form stencil 16 is formed having a pattern of apertures 20 formed therethrough. The pattern of apertures 20 corresponds to the pattern of exposed conductive surfaces of the BGA or CSP package.

In one embodiment of the invention, pre-form stencil 16 also includes a solder sphere dam 18 which surrounds aperture pattern 20. Sphere dam 18 may also include a sphere outlet 19 for providing a point of discharge for solder spheres as they are distributed across the face of pre-form stencil 16.

Figure 4:
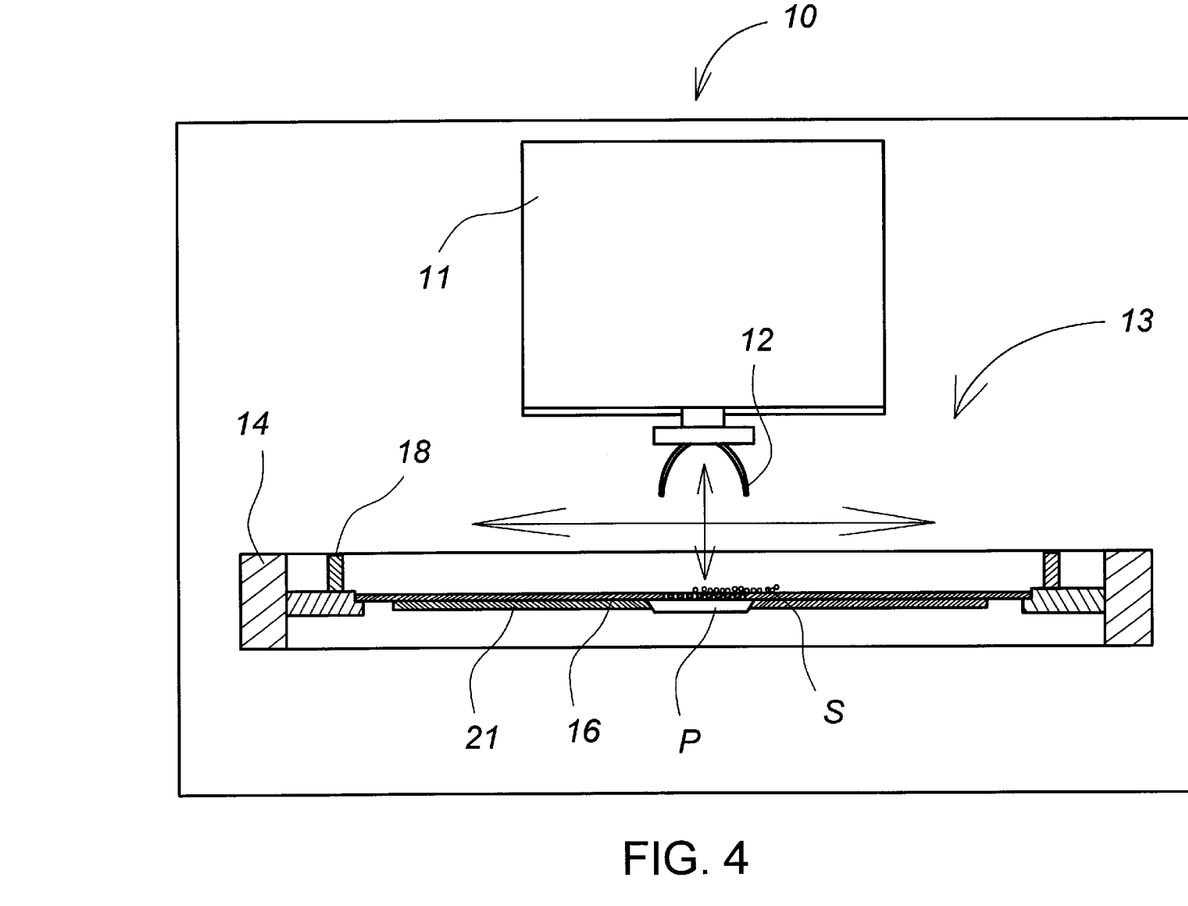
FIG. 4 is a schematic cross-sectional representation of a pre-form stencil utilized for high volume BGA solder sphere alignment and placement.

Referring to FIG. 4, stencil printer 10 is shown. Stencil printer 10 includes print head 11 having U-shaped wiper fixture 12. Direction arrows indicate the movement of print head 11 and U-shaped wiper fixture 12 in a vertical axis to contact the upper face of stencil 16 and in a horizontal axis to distribute solder spheres S. Stencil printer 10 also includes stencil assembly 13 having stencil frame 14. Pre-form stencil 16 is shown set into a recess of stencil frame 14 which provides proper alignment of pre-form stencil 16 in the X and Y axis. Package carriage 21 is shown supporting ball grid array package P against the underside of pre-form stencil 16. Pre-form stencil 16 is shown including sphere dam 18. Package carriage 21 is held against the underside of pre-form stencil 16 by a vacuum (not shown).

Figure 5:
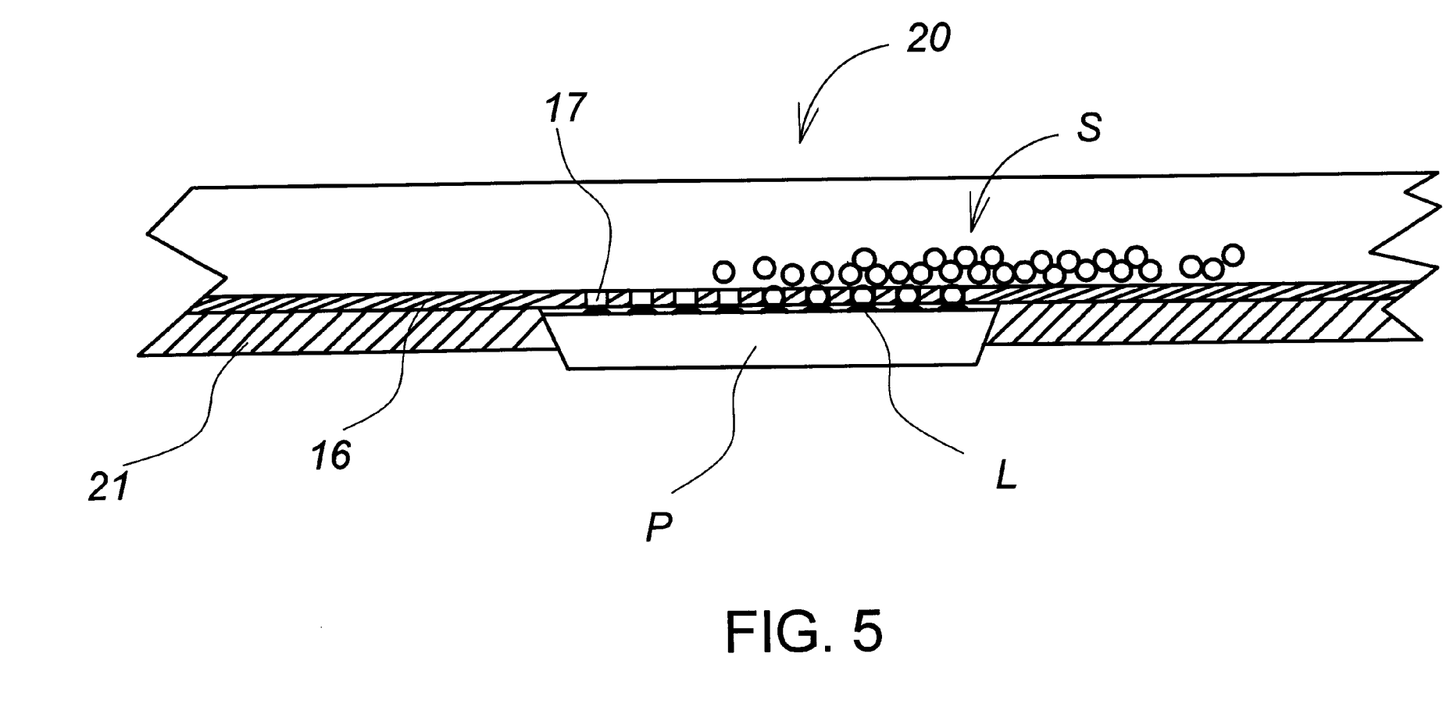
FIG. 5 is a schematic cross-sectional representation of a pre-form stencil utilized for high volume BGA solder sphere alignment and placement.

While FIG. 4 shows a single BGA package P mounted in stencil assembly 13, it should be understood that the invention may be employed utilizing a pre-form stencil that may accommodate a plurality of electrical components including a plurality of BGA or μBGA packages. Referring to FIG. 5, package carriage 21 is again shown supporting pre-form stencil 16. Ball grid array package P is shown supported by package carriage 21. FIG. 5 also shows pre-form stencil 16 including aperture pattern 20. FIG. 5 demonstrates how solder spheres S are applied across the face of pre-form stencil 16 with preformed solder spheres S falling through aperture 17 against conductive lands L.

Figure 6:
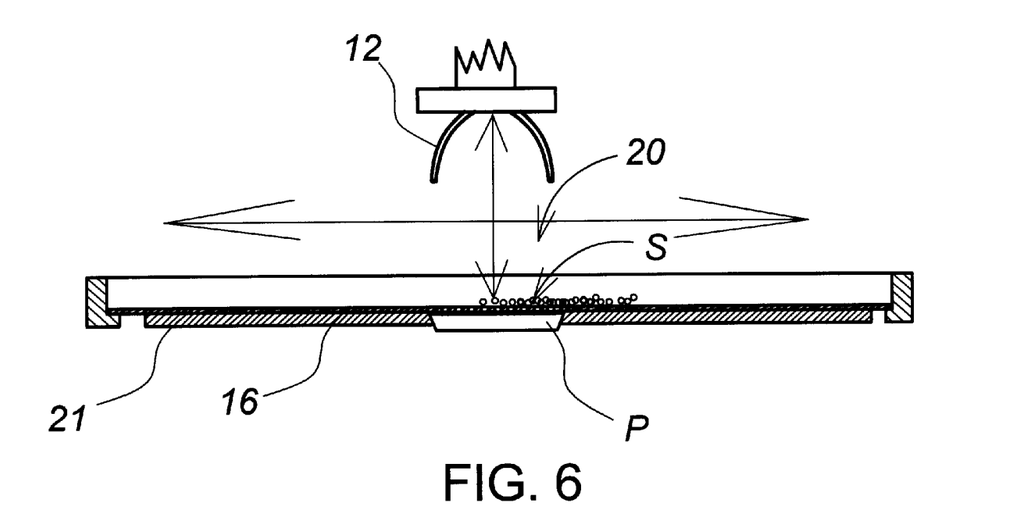
FIG. 6 is a schematic cross-sectional representation of a pre-form stencil showing a generally U-shaped wiper blade being utilized for high volume BGA solder sphere alignment and placement.

FIG. 6 shows solder spheres S being moved across the face of pre-form stencil 16 by generally U-shaped wiper fixture 12. U-shaped wiper fixture 12 moves back and forth across the face of pre-form stencil 16 distributing solder spheres S. Direction arrows indicate the movement of print head 11 and U-shaped wiper fixture 12 in a vertical axis to contact the upper face of stencil 16 and in a horizontal axis to distribute solder spheres S.

Figure 7:
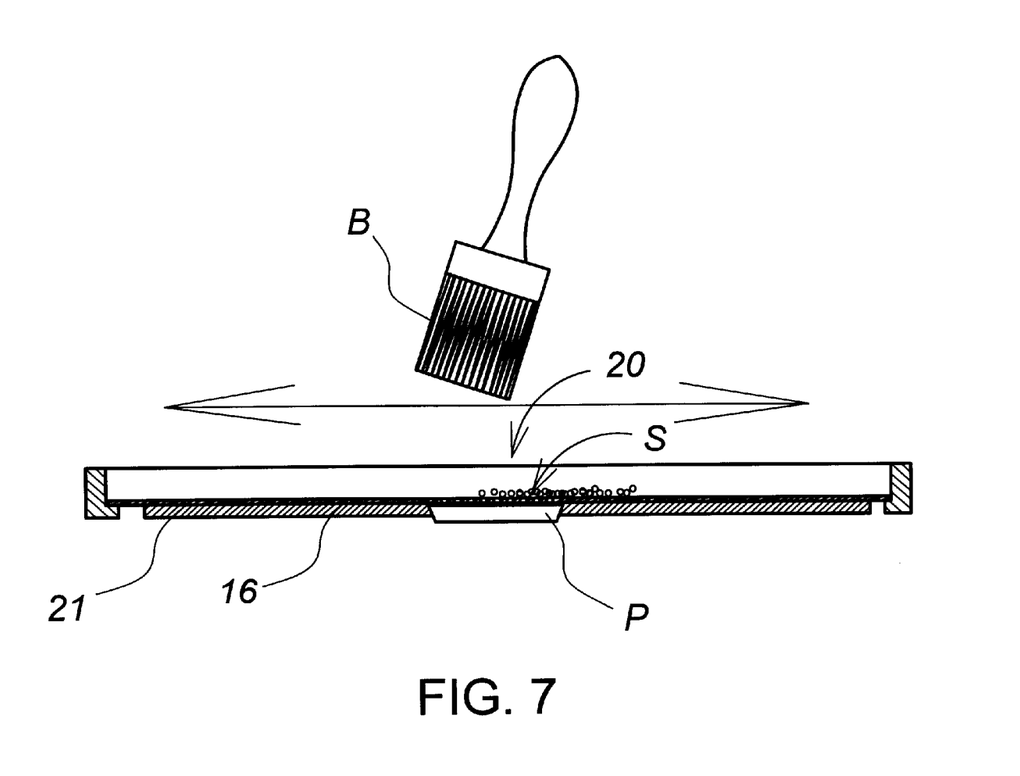
FIG. 7 is a schematic cross-sectional representation of a pre-form stencil showing a brush being utilized for high volume BGA solder sphere alignment and placement.

FIG. 7 demonstrates that this same method may be effectively accomplished using brush B or other means for distributing solder spheres S across the face of pre-form stencil 16.

A method for high volume BGA solder sphere alignment and placement may include the following steps:

Placing a BGA or CSP package having a plurality of conductive lands formed on a first face into a first screen printer with a flux screen contacting the first face of the BGA or CSP package substrate;

Applying a flux to the BGA or CSP package electrically conductive lands through the flux screen;

Placing the BGA or CSP package in a second printer having a pre-form stencil, the pre-form stencil having a pattern of oversized apertures formed through the cross-section of the pre-form stencil, the pattern of apertures corresponding to the pattern of conductive lands formed on the first face of the BGA or CSP package;

Applying a plurality of solder spheres through the pattern of oversized apertures formed through the cross-section of the pre-form stencil;

Alternately, a method for high volume BGA solder sphere alignment and placement may include the following steps:

Placing a BGA or CSP package having a plurality of conductive lands formed on a first face into a first screen printer with a flux screen contacting the first face of the BGA or CSP package substrate;

Applying a flux to the BGA or CSP package electrically conductive lands through the flux screen;

Replacing the flux screen in the first screen printer with a pre-form stencil having a pattern of oversized apertures formed through the cross-section of the pre-form stencil, the pattern of apertures corresponding to the pattern of conductive lands formed on the first face of the BGA or CSP package;

Applying a plurality of solder spheres through the pattern of oversized apertures formed through the cross-section of the pre-form stencil using a print head of the first screen printer;

Reflowing the solder spheres to the BGA or CSP package electrically conductive lands of the BGA or CSP package.

While there is shown and described the preferred embodiment of the invention, it is to be distinctly understood that this invention is not limited thereto but may be variously embodied to practice within the scope of the following claims.

I claim:

1. A device for high volume alignment and placement of solder spheres comprising:

a pre-form stencil formed of a sheet material selected from a group of nickel-chromium materials;

a pattern of apertures formed through the cross section of the pre-form stencil, the pattern of apertures corresponding to a pattern of exposed conductive surfaces, each aperture formed having a diameter equal to approximately 5% larger in diameter than the solder spheres being aligned and placed.

2. The device for high volume alignment and placement of solder spheres of claim 1 wherein each aperture further comprises a solder phobic barrel.

3. The device for high volume alignment and placement of solder spheres of claim 2 wherein the solder phobic barrel is formed of titanium.

4. The device for high volume alignment and placement of solder spheres of claim 1 wherein the pre-form stencil is formed from stainless steel.

5. The device for high volume alignment and placement of solder spheres of claim 1 wherein the pre-form stencil is formed of a material having a thickness of 0.010" to 0.035".

6. A device for high volume alignment and placement of solder spheres comprising:

a pre-form stencil formed of a polyetherimide resin;

a pattern of apertures formed through the cross section of the pre-form stencil, the pattern of apertures corresponding to a pattern of exposed conductive surfaces, each aperture formed having a diameter equal to approximately 5% larger in diameter than the solder spheres being aligned and placed.

7. The device for high volume alignment and placement of solder spheres of claim 6 wherein each aperture further comprises a solder phobic barrel.

8. The device for high volume alignment and placement of solder spheres of claim 6 wherein the pre-form stencil is formed of a material having a thickness of 0.010" to 0.035".

* * * * *